United States Patent
Kang et al.

(10) Patent No.: US 8,208,298 B2
(45) Date of Patent: *Jun. 26, 2012

(54) MSB-BASED ERROR CORRECTION FOR FLASH MEMORY SYSTEM

(75) Inventors: Dong-Ku Kang, Gyeonggi-do (KR); Seung-Jae Lee, Gyeonggi-do (KR); Jun-Jin Kong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 90 days.

This patent is subject to a terminal disclaimer.

(21) Appl. No.: 12/836,249

(22) Filed: Jul. 14, 2010

(65) Prior Publication Data

US 2010/0277979 A1 Nov. 4, 2010

Related U.S. Application Data

(63) Continuation of application No. 12/169,109, filed on Jul. 8, 2008, now Pat. No. 7,791,938.

(30) Foreign Application Priority Data

Jul. 9, 2007 (KR) ........................ 10-2007-0068681

(51) Int. Cl.
*G11C 11/34* (2006.01)
*G11C 16/04* (2006.01)

(52) U.S. Cl. .............................. 365/185.03; 365/185.12

(58) Field of Classification Search ............. 365/185.03, 365/185.09, 185.12
See application file for complete search history.

(56) References Cited

U.S. PATENT DOCUMENTS

| | | | |
|---|---|---|---|
| 5,923,586 A | 7/1999 | Choi | |
| 6,082,056 A | 7/2000 | Hoberman | |
| 6,259,627 B1 | 7/2001 | Wong | |
| 6,266,270 B1 | 7/2001 | Nobukata | |
| 6,751,766 B2 | 6/2004 | Guterman et al. | |
| 6,914,823 B2 | 7/2005 | Chen et al. | |
| 7,035,144 B2 | 4/2006 | Kim et al. | |
| 7,102,924 B2 | 9/2006 | Chen et al. | |
| 7,360,136 B2 | 4/2008 | Guterman et al. | |
| 7,508,705 B2 * | 3/2009 | Chae et al. | 365/185.03 |
| 7,755,950 B2 * | 7/2010 | Yu et al. | 365/185.28 |
| 2006/0221692 A1 | 10/2006 | Chen | |
| 2008/0215930 A1 | 9/2008 | Radke | |
| 2009/0185425 A1 | 7/2009 | Ravasio et al. | |
| 2009/0310406 A1 | 12/2009 | Sarin et al. | |

FOREIGN PATENT DOCUMENTS

| | | |
|---|---|---|
| KR | 10-2005-0027216 A | 3/2005 |
| KR | 10-2006-0114319 A | 11/2006 |

* cited by examiner

*Primary Examiner* — Anh Phung
(74) *Attorney, Agent, or Firm* — Myers Bigel Sibley & Sajovec, P.A.

(57) ABSTRACT

A flash memory system includes a multi-bit flash memory device having a memory cell array including memory cells arranged in rows and columns; a read circuit configured to read data from the memory cell array; and control logic configured to control the read circuit so as to successively read data from a selected memory cell and adjacent memory cells to the selected memory cell in response to a request for a read operation with respect to MSB data stored in the selected memory cell. A compare circuit is configured to compare data read from the adjacent memory cells to the selected memory cell provided from the multi-bit flash memory device and to correct data read from the selected memory cells based upon the comparison result.

35 Claims, 14 Drawing Sheets

Fig. 4
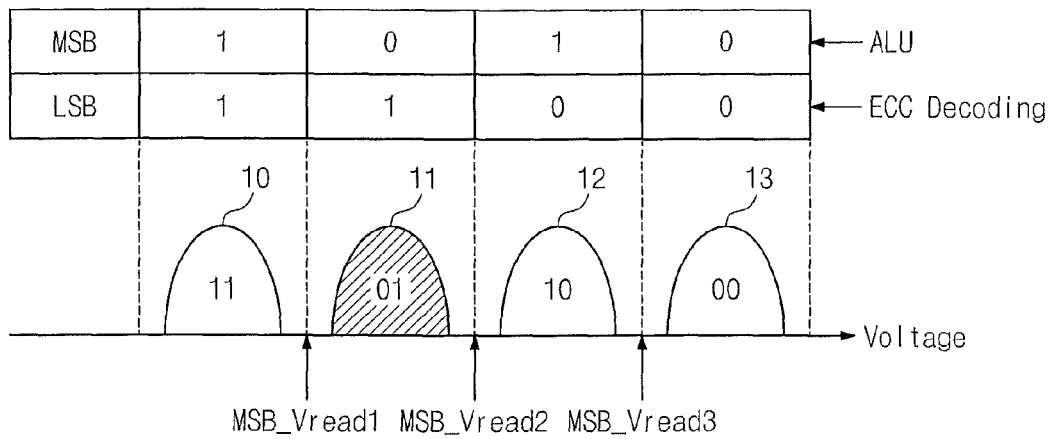
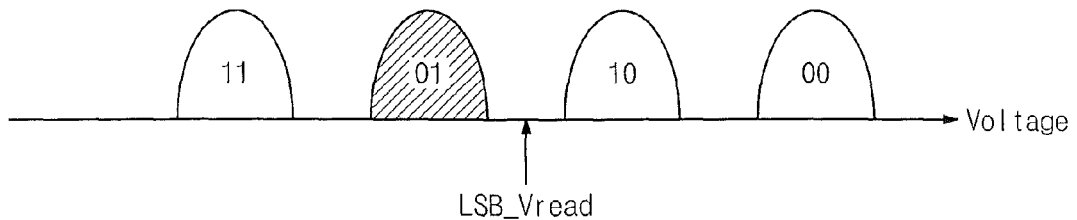

Fig. 5
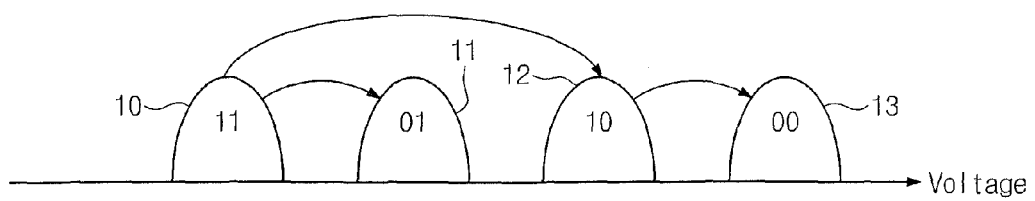
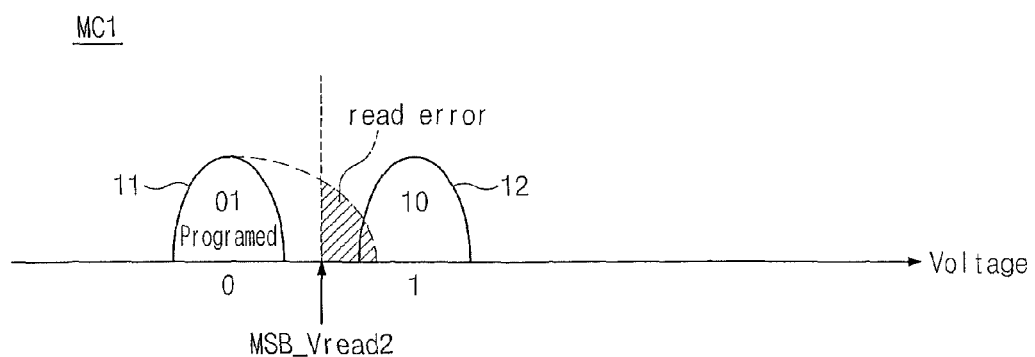
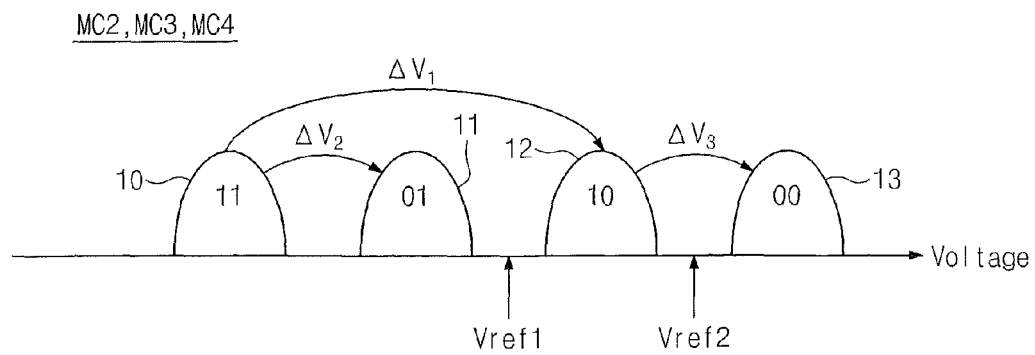

MSB-BASED ERROR CORRECTION FOR FLASH MEMORY SYSTEM

CROSS-REFERENCE TO RELATED APPLICATIONS

This application is a continuation of U.S. application Ser. No. 12/169,109, filed Jul. 8, 2008, now U.S. Pat. No. 7,791,938, issued Sep. 7, 2010, and claims priority under 35 U.S.C. §119 to Korean Patent Application 2007-0068681, filed on Jul. 9, 2007, the disclosure of which is hereby incorporated herein by reference in its entirety as if set forth fully herein.

FIELD OF THE INVENTION

The present invention relates to flash memory systems and, more particularly, to flash memory systems having error correction.

BACKGROUND OF THE INVENTION

Flash memory devices are a type of EEPROM in which a plurality of memory areas are erased or programmed by one programming operation. Since the EEPROM is capable of being programmed or erased electrically, it is widely used, for example, to store system programming that is continuously updated or as an auxiliary memory device. Particularly, flash EEPROM (hereinafter, referred to as flash memory device) may be used in mass storage devices because its integration may be high as compared to a conventional EEPROM.

Generally, a flash memory system includes a flash memory device and a flash memory controller controlling the flash memory device. The flash memory device comprises a plurality of memory cells arranged in a matrix of rows and columns. The flash memory device may be categorized into NOR-type and NAND-type depending on connection patterns between memory cells and bit lines. The NAND-type flash memory device may be amenable to high integration because it can consume less cell current than the NOR-type flash memory device. The NAND-type flash memory device may be categorized into single level cell (SLC) NAND-type flash memory device and a multi level cell (MLC) NAND-type flash memory device. The SLC NAND-type flash memory is capable of storing one-bit data per cell while the MLC NAND-type flash memory device is capable of storing multi-bit data per cell. MLC NAND-type flash memory devices are disclosed in U.S. Pat. Nos. 7,035,144, 6,082,056, and 5,923,586 and U.S. Patent Application Publication No. 2006/0221692, the contents of which are herein incorporated by reference.

In the case that one-bit data is stored to a memory cell during a programming operation, the memory cell has a threshold voltage in either one of two threshold voltage distributions. In other words, the memory cell has a threshold voltage in a threshold voltage distribution corresponding to either one of two states indicating data "1" and data "0", respectively. In a case where 2-bit data is stored to a memory cell, the memory cell has a threshold voltage in any one of four threshold voltage distributions. In other words, the memory cell has a threshold voltage in a threshold voltage distribution corresponding to one of four states indicating data "11", data "10", data "00", and data "01", respectively. Further, in the case that three-bit data is stored to a memory cell, the memory cell has a threshold voltage in any one of eight threshold voltage distributions. In a case where four-bit data is stored to a memory cell, the memory cell has a threshold voltage in any one of sixteen threshold voltage distributions, etc.

Threshold voltage distributions corresponding to respective data states exist within a predetermined window. The threshold voltage distributions are controlled precisely so that respective threshold voltage distributions exist within the predetermined window. Generally, flash memory devices are programmed by an incremental step pulse programming (ISPP) scheme which has been utilized to control threshold voltage distributions precisely. An exemplary programming method of the flash memory device using ISPP scheme is disclosed in U.S. Pat. No. 6,266,270 entitled "Non-Volatile Semiconductor Memory and Programming Method of the Same", the contents of which are herein incorporated by reference.

Threshold voltage distributions corresponding to respective data states should be placed below the highest voltage level of the predetermined window. As the number of data bits stored to respective memory cells is increased, there is also an increase in the number of threshold voltage distributions corresponding to respective data states. In this case, an interval (or margin) between adjacent threshold voltage distributions generally narrows. Threshold voltage distributions corresponding to respective data states may be expanded by various factors. For example, when a programming operation is performed, previously programmed memory cells are affected by coupling with adjacent memory cells that are programmed afterward. This means that threshold voltage distributions may be widened. Thus, in a case where the number of data bits stored to respective memory cells is increased, threshold voltage distributions corresponding to respective data states may be overlapped. In this case, there may be an increase the probability of read error.

The read error may be detected and corrected via an error correction circuit in a flash memory controller. But, if the number of the detected erroneous data bits is increased, the burden of the error correction circuit may be increased more and more.

SUMMARY OF THE INVENTION

Some embodiments of the present invention are directed to a flash memory system which comprises a multi-bit flash memory device including a memory cell array having memory cells arranged in rows and columns; a read circuit configured to read data from the memory cell array; and control logic configured to control the read circuit so as to successively read data from a selected memory cell and adjacent memory cells to the selected memory cell in response to a request for a read operation for Most Significant Bit (MSB) data stored in the selected memory cell. A compare circuit is configured to compare data read from the adjacent memory cells to the selected memory cell provided from the multi-bit flash memory device and to correct data read from the selected memory cell based upon a comparison result.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures:

FIG. 4 is a diagram for describing a read operation with respect to memory cells programmed with 2-bit data according to various embodiments of the present invention.

FIG. 5 is a diagram for describing both coupling effect and an operation where a set of reference voltages are established.

DETAILED DESCRIPTION OF PREFERRED EMBODIMENTS

Figure 1:
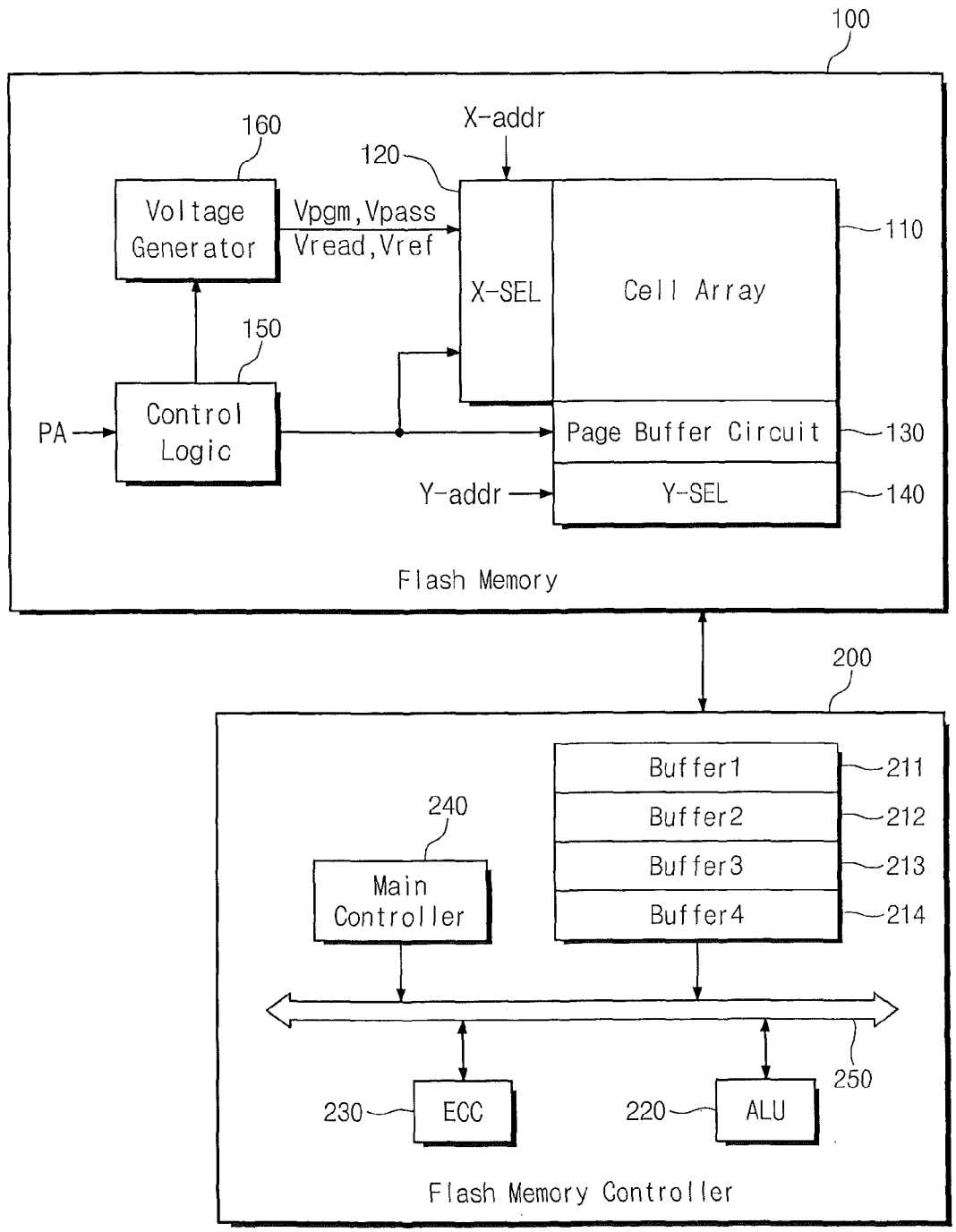
FIG. 1 is a block diagram showing a flash memory system according to first embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element is referred to as being "responsive to" another element (and variants thereof), it can be directly responsive to the other element or intervening elements may be present. In contrast, when an element is referred to as being "directly responsive to" another element (and variants thereof), there are no intervening elements present. Like reference numerals refer to like elements throughout. As used herein, the term "and/or" includes any and all combinations of one or more of the associated listed items and may be abbreviated as "/".

It will be understood that, although the terms first, second, odd, even, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or odd element, component, region, layer or section discussed below could be termed a second or even element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It also will be understood that, as used herein, the terms "row" or "horizontal" and "column" or "vertical" indicate two relative non-parallel directions that may be orthogonal to one another. However, these terms also are intended to encompass different orientations.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

The present invention is described in part below with reference to block diagrams and flowcharts of methods, systems and circuits according to embodiments of the invention. A given block or blocks of the block diagrams and/or flowcharts provides support for methods, circuits and/or systems (structural and/or means-plus-function).

It should also be noted that in some alternate implementations, the functions/acts noted in the flowcharts may occur out of the order noted in the flowcharts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
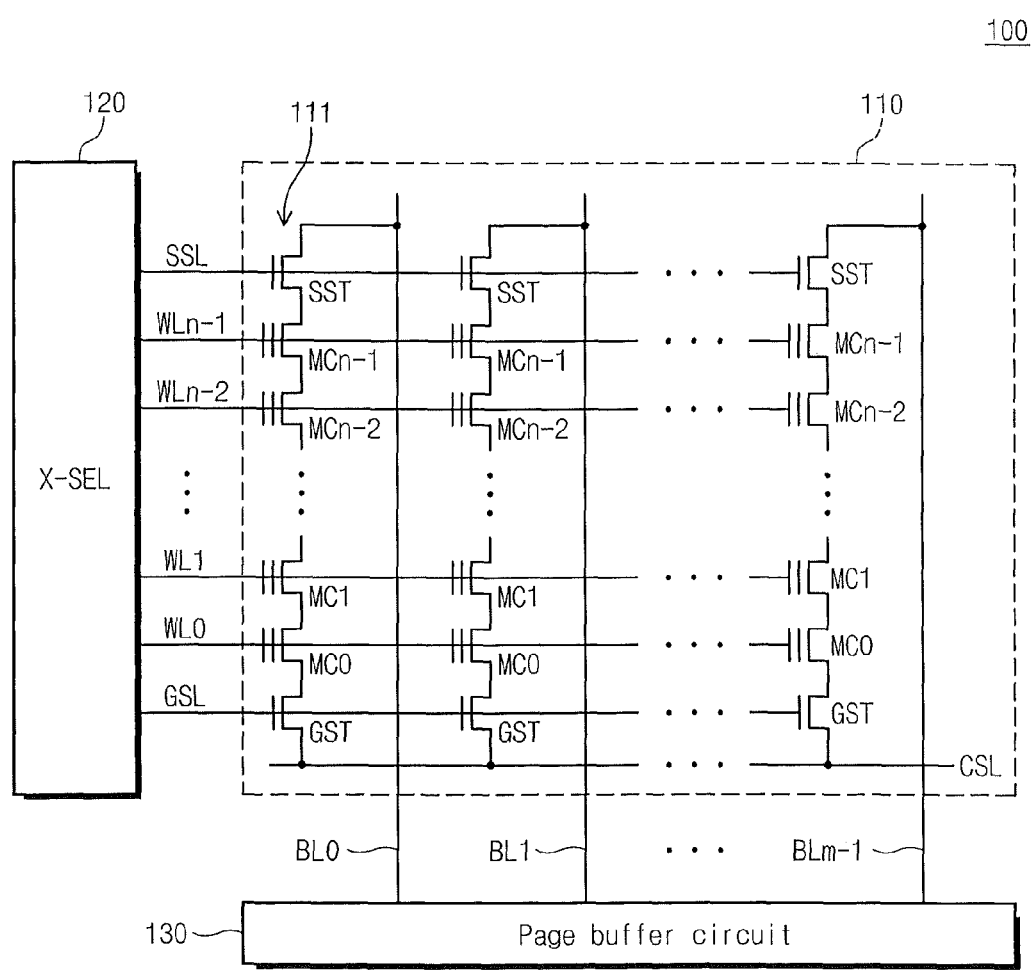
FIG. 2 is a diagram showing a memory cell array illustrated in FIG. 1.

FIG. 1 is a schematic block diagram of a flash memory system according to first embodiments of the present invention, and FIG. 2 is a diagram showing a memory cell array illustrated in FIG. 1.

Referring to FIGS. 1 and 2, a flash memory system 1000 according to some embodiments of the present invention comprises a flash memory 100 and a flash memory controller 200 to control the flash memory 100. The flash memory 100 is, for example, a multi-bit flash memory device. During a read operation, read data from the flash memory 100 is provided to the flash memory controller 200.

The flash memory 100 includes a memory cell array 110, a row select circuit (X-SEL) 120, a page buffer circuit 130, a column select circuit (Y-SEL) 140, control logic 150, and a voltage generator 160. The flash memory controller 200 includes first through fourth buffers 211~214, an Arithmetic and Logic Unit (hereinafter, referred to as ALU) 220, an error correction circuit 230, a main controller 240, and a system bus 250. In these embodiments, the row select circuit 120, the page buffer circuit 130 and the voltage generator 160 may provide a read circuit and the first to fourth buffers 211~214 may provide a buffer block.

As illustrated in FIG. 2, the memory cell array 110 includes a plurality of cell strings (or NAND strings) 111, which are connected to bit lines BL0~BLm−1, respectively. A cell string 111 in each column is formed of a string selection transistor SST as a first selection transistor, a ground selection transistor GST as a second selection transistor, and a plurality of flash EEPROM cells or other nonvolatile memory cells MC0~MCn−1 that are serially connected between the selection transistors SST and GST. The string selection transistor SST in each column has a drain connected to a corresponding bit line and a gate connected to a string selection line SSL. The ground selection transistor GST in each string has a source connected to a common source line CSL and a gate connected to a ground selection line GSL. In respective strings, memory cells MC0~MCn−1 are serially connected between the source of the string selection transistor SST and the drain of the ground selection transistor GST. Memory cells of the respective cell strings may be formed of floating gate transistors, control gates of which are connected to corresponding word lines WL0~WLn−1, respectively.

The string selection line SSL, the word lines WL0~WLn−1, and the ground selection line GSL are electrically connected to the row select circuit 120. The row select circuit 120 selects one of the word lines WL0~WLn−1 in response to row address information and provides corresponding word line voltages to the selected word line and non-selected word lines according to operation modes. For example, in a program operation, the row select circuit 120 provides a program voltage to a selected word line and a pass voltage to non-selected word lines. In a read operation, the row select circuit 120 provides a desired voltage to a selected word line and a read voltage to non-selected word lines. The program voltage, the pass voltage, and the read voltage are generally higher than a power supply voltage. The bit lines BL0~BLm−1 are electrically connected to the page buffer circuit 130. The page buffer circuit 130 senses data from memory cells of a selected word line through the bit lines BL0~BLm−1 in read/verification operation mode. In a program operation, the page buffer circuit 130 provides a power voltage (or a program-inhibit voltage) or a ground voltage (or a program voltage) to the respective bit lines BL0~BLm−1 according to data to be programmed. Although not illustrated in FIG. 2, the page buffer circuit 130 may include page buffers that correspond to the bit lines BL0~BLm−1, respectively. Each page buffer may be embodied so as to share two bit lines.

Returning to FIG. 1, during a read operation, the column select circuit 140 provides data sensed by the page buffer circuit 130 to the memory controller 200 in response to column address information Y-addr. The control logic 150 is configured to control an overall operation of the flash memory 100. The voltage generator 160 is controlled by the control logic 150 and configured to generate various voltages (e.g., a program voltage Vpgm, a read voltage Vread, a pass voltage Vpass, a reference voltage Vref and the like) used for an operation of the flash memory 100. The reference voltage Vref is one of read voltages used to perform a read operation, which will be more fully described later.

The main controller 240 of the flash memory controller 200 controls remaining constituent elements of the flash memory controller 200.

In a read operation, the page buffer circuit 130 reads data bits from the cell array and the read data bits are transmitted to the flash memory controller 200 through the column select circuit 140. Data bits provided to the flash memory controller 200 may be provided to the first through fourth buffers 211~214 of the flash memory controller 200 or to the error correction circuit 230 of the flash memory controller 200, in accordance with an order in which the read data bits are programmed. In a case where the read data bits provided to the first buffer 211 are MSB data bits, the MSB data bits are provided to the ALU 220 under the control of the main controller 240. In the case that the data bits provided to the first buffer 211 are Least Significant Bit (LSB) data bits, the LSB data bits are provided to the ECC 230 under the control of the main controller 240. Data bits temporarily stored in the second through fourth buffers 212~214 are provided to the ALU 220. The ALU 220 provides the MSB data bits provided from the first buffer 211 to the ECC 230. At this time, the ALU 220 compares data bits provided from the second through fourth buffers 212~214 and corrects the MSB data bits provided through the first buffer 211 in accordance with the compared result. Thus, embodiments of a compare circuit are provided.

The ECC 230 generates an error correcting code (hereinafter, referred to as ECC data) from data (or, program data) that is provided to the page buffer circuit 130 through the row select circuit 140 during a program operation. The generated ECC data is transmitted to the page buffer circuit 130 through the row select circuit 140. The page buffer circuit 130 includes a main area (not shown) and a spare area (not shown). The main area is used to store the program data and the spare area is used to store the ECC data. In a read operation, read data and ECC data are transmitted to the error correction circuit 230 from the page buffer circuit 130. The ECC 230 detects whether the read data is erroneous on the basis of the ECC data, and corrects detected erroneous data bits. Also, the error correction circuit 230 detects whether data bits provided through ALU 220 and the first buffer 211 are erroneous, and corrects detected erroneous data bits. Hereinafter, the above-described correcting operation of the error correction circuit 230 is called "ECC decoding". The error correction circuit 230 corrects erroneous data bit among provided data bits and outputs the error-corrected data bits. Thus, embodiments of a compare circuit are provided.

With the above-described read operation of the flash memory system 1000, the ALU 220 of the flash memory controller 200 corrects data bits based upon a given condition. Thus, a flash memory system 1000 according to various embodiments of the present invention is capable of reducing the number of error bits, which are corrected by the error correction circuit 230. This means that an overhead of the error correction circuit 230 can be reduced.

Figure 3:
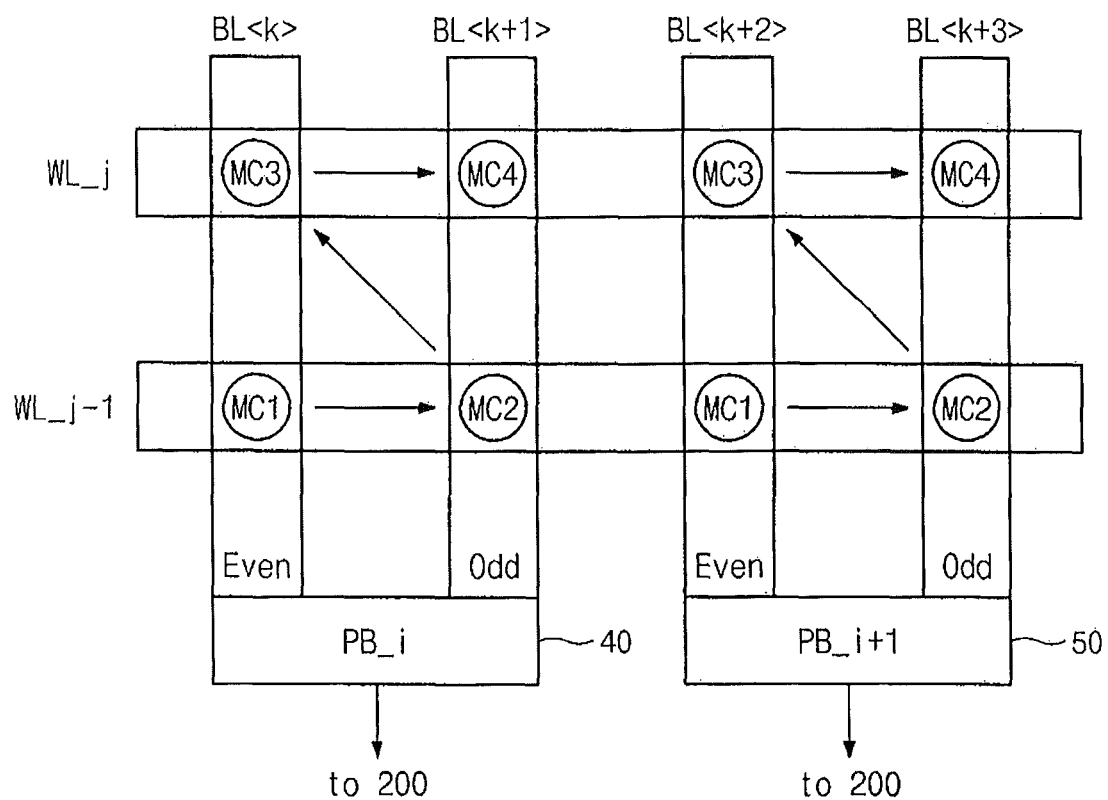
FIG. 3 is a diagram showing a programming sequence of memory cells in word lines illustrated in FIG. 2.

FIG. 3 is a diagram showing a programming sequence of memory cells in any word lines illustrated in FIG. 2.

Memory cells illustrated in FIG. 3 are any memory cells among memory cells of the memory cell array illustrated in FIG. 2.

Referring to FIG. 3, word lines WL_j−1 and WL_j include even and odd pages, respectively. The even page of the word line WL_j−1 includes memory cells MC1, and the odd page of the word line WL_j−1 includes memory cells MC2. The even page of the word line WL_j includes memory cells MC3, and the odd page of the word line WL_j includes memory cells MC4. Each of Page buffers 40 and 50 is electrically connected to two bit lines. Hereinafter, bit lines in the even page are called the first bit lines, and bit lines in the odd page are called the second bit lines.

During a program operation, as is illustrated in FIG. 3, memory cells MC1~MC4 may be programmed according to a given sequence: MC1→MC2→MC3→MC4. Although not illustrated in FIG. 3, remaining memory cells may be programmed in the same sequence. In other words, even pages of respective word lines are programmed and then odd pages of the respective word lines are programmed. In other embodiments, other program sequences may be used.

A threshold voltage of a programmed memory cell MC1 may be affected when adjacent memory cells MC2, MC3 and MC4 are programmed, respectively. In other words, the threshold voltage of the memory cell MC1 may be affected due to coupling with the adjacent memory cells MC2, MC3 and MC4 that are programmed afterward. Also, the threshold voltage of the memory cell MC2 may be affected due to coupling with the adjacent memory cells MC3 and MC4 that are programmed afterward, and the threshold voltage of the memory cell MC3 may be affected due to coupling with the adjacent memory cell MC4 that is programmed afterward. Although not illustrated in FIG. 3, the threshold voltage of the memory cell MC4 may be affected when programming memory cells in even and odd pages of a word line that is to be selected afterward. Among the memory cells MC1~MC4, the memory cell MC1 may suffer from the highest coupling effect. Thus, the threshold voltage of the memory cell MC1 may suffer from the most variation as compared with that of each of remaining memory cells MC1~MC4. Also, the threshold voltage of the memory cell MC3 may be shifted due to the coupling with memory cells of even and odd pages in a next word line. As a result, shifting of threshold voltages of memory cells may cause expansion of threshold voltage distributions. Hereinafter, a read operation of the present flash memory system 1000 will be more fully described on the basis of a memory cell MC1 illustrated in FIG. 3.

When a data state of a given memory cell is altered according to the programming, the more a variation of the threshold voltage, the more the coupling effect, which will be more fully described with reference to FIG. 5. Thus, the more the variation of the threshold voltages of the memory cells MC2, MC3 and MC4, the higher the threshold voltage of the memory cell MC1. In this case, the probability that an error rate of data read from the memory cell MC1 may become high.

In the case that threshold voltages of the memory cells MC2, MC3 and MC4 are varied most, the memory cell MC1 may suffer from the most coupling effect. In this case, data read from the memory cell MC1 may be detected to always be erroneous. Such a state of the memory cell MC1 is called a "fail state". In other words, the memory cell MC1 suffering from the worst coupling effect may have a fail state.

In a read operation, the flash memory controller 200 transmits address information and a read command to the flash memory 100. The address information includes a row address X-addr and a column address Y-addr, and the row address X-addr includes a page address PA. The page address PA includes an MSB page address and an LSB page address. If the even page is programmed prior to the odd page, during a read operation, the flash memory controller 200 transmits the address information and read command to the flash memory 100 to read data from the memory cell MC1. The control logic 150 of the flash memory 100 performs a read operation continuously four times in response to the read command and the address information transmitted from the memory controller 200. In particular, when the MSB address is issued, the control logic 150 controls the read circuit in response to the MSB page address of the page address PA corresponding to the even page, so that the read circuit carries out a read operation continuously four times. In other words, in the case that the MSB data bit of the memory cell MC1 is read, data bits are sequentially read from the respective memory cells MC2, MC3 and MC4 under the control of the control logic 150.

The above-described sequential read operation may be performed differently. The flash memory controller 200 transmits to the flash memory 100 the address information and read command so as to read data from the memory cell MC1 and the address information and read command so as to read data from the respective memory cells MC2~MC4. In a case where an MSB data bit is read from the memory cell MC1 in response to the address information and read command sequentially transmitted from the flash memory controller 200, the control logic 150 of the flash memory 100 controls the read circuit to read respective data bits from memory cells MC2, MC3 and MC4.

Referring to FIGS. 1 to 3, an MSB data bit of the memory cell MC1 is provided to the flash memory controller 200 from the page buffer circuit 130 through the column selection circuit 140. Respective data bits of the memory cells MC2~MC4 are read based on reference voltages Vref1 and Vref2, and the read data bits are provided to the flash memory controller 200. The reference voltages Vref1 and Vref2 are read voltages used to read a data state suffering from the most threshold voltage variation, when data states of the memory cells MC2, MC3 and MC4 are altered after program operations.

An MSB data bit read from the memory cell MC1 is provided to the first buffer 211 of the flash memory controller 200. Data bits read from the memory cells MC2, MC3 and MC4 are provided to corresponding second through fourth buffers 212~214, respectively.

In a case where the memory cells MC2 to MC4 are programmed to have the most threshold voltage variation, the memory cell MC1 may suffer from the worst coupling effect. In this case, data read from the memory cell MC1 may be determined to be erroneous every time.

The ALU 220 may be supplied with data bits from the second through fourth buffers 212~214. In the case that each of the data bits provided from the second through the fourth buffers 212~214 has a value corresponding to the most threshold voltage variation, the ALU 220 corrects the MSB data bit provided from the first buffer 211 that is not an erroneous bit. Since the memory cells MC2 to MC4 are programmed to have the most threshold voltage variation, the memory cell MC1 may suffer from the worst coupling effect. For this reason, data read from the memory cell MC1 may be determined to be erroneous every time. Accordingly, when the data bits provided from the second through the fourth buffers 212~214 are determined to have a value corresponding to the most threshold voltage variation, the ALU 220 corrects the MSB data bit provided from the first buffer 211.

If the above-described condition is satisfied, the ALU 220 may invert an MSB data bit provided thereto, as will be more fully described hereinafter. The data bit corrected by the ALU 200 is provided to the error correction circuit 230. The data bit corrected by the ALU 200 may be an error bit, which will be more fully described hereinafter. Thus, if the data bit corrected by the ALU 200 is a normal data bit, no error correction circuit 230 corrects the data bit provided from the ALU 220.

If the ALU 220 corrects a data bit erroneously, the error correction circuit 230 corrects a data bit corrected by and provided from the ALU 220. In other words, the error correction circuit 230 performs a second correction operation with respect to the data bit corrected by the ALU 220.

In a case where at least one of the memory cells MC2 through MC4 is not programmed to have the most threshold voltage variation, the memory cell MC1 may not suffer from the worst coupling effect. In this case, the ALU 220 does not correct the MSB data bit provided from the first buffer 221. The ALU 220 provides the MSB data bit to the error correction circuit 230. Although all data bits provided through the second through fourth buffers 211~214 are not programmed to have a value corresponding to the most threshold voltage variation, the memory cell MC1 may suffer from the coupling effect. For this reason, the data bit read from the memory cell MC1 may be determined to be erroneous. Accordingly, the error correction circuit 230 detects a bit provided from the ALU 220 to be erroneous and corrects the provided bit according to a detection result.

During a read operation, the control logic 150 of the flash memory 100 controls the read circuit to perform a read operation in response to the LSB page address of the page address PA corresponding to the even page. In this time, an LSB data bit is read from the memory cell MC1 while data bits are not read from the memory cells MC2, MC3 and MC4. The LSB data bit read from the memory cell MC1 is transmitted to the error correction circuit 230 through the first buffer 211 of the flash memory controller 200. The LSB data bit read from the memory cell MC1 is not corrected by the ALU 220. Thus, when the LSB data bit is read from the memory cell MC1, no read operation is carried out with respect to the memory cells MC2, MC3 and MC4. As above stated, the error correction circuit 230 detects whether a data bit from the first buffer 211 is erroneous and corrects the data bit according to a detection result.

The ALU 220 of the flash memory system 1000 according to various embodiments of the present invention compares data bits from the second through fourth buffers 212~214 and corrects a data bit from the first buffer 211 according to the comparison result. In other words, in case of the flash memory system 1000, the ALU 220 first corrects data bits having the highest error probability, and the error correction circuit 230 then corrects data bits from the ALU 220. As a result, since the number of erroneous bits to be corrected by the error correction circuit 230 may be reduced, it is possible to reduce an overhead of the error correction circuit 230. Thus, embodiments of a compare circuit are provided.

During a read operation, as was above stated, an LSB data bit read from the memory cell MC1 is directly provided to the error correction circuit 230 through the page buffer 130, not to the first buffer 211.

FIG. 4 is a diagram for describing a read operation with respect to memory cells programmed with 2-bit data according to various embodiments of the present invention.

A distribution chart illustrated in FIG. 4 is related to a memory cell capable of storing two-bit data. However, the memory cell of the flash memory system 1000 according to the present invention is capable of storing m-bit data (m is 3 or more). Also, an exemplary 2-bit coding table is illustrated in FIG. 4. But, other embodiments may be coded differently from that in FIG. 4.

Referring to FIG. 4, during a program operation, memory cells of the flash memory system 1000 are capable of storing any one among data '11', data '01', data '10' and data '00'. In FIG. 4, a curve 10 indicating data '11' corresponds to an erase state. Remaining curves 11 to 13 correspond to program states, respectively.

During a read operation, if a threshold voltage of a selected memory cell is higher than a read voltage, the selected memory cell is determined to be off. If its threshold voltage is lower than the read voltage, it is determined to be on. When an operation for reading an MSB data bit from a selected memory cell is performed, the highest read voltage is applied to the selected memory cell. The highest read voltage may include a plurality of MSB read voltages. A read voltage applied to a selected memory cell may be determined to be a voltage that is applied to discriminate data '1' and data '0' and vice versa. MSB data bits each corresponding threshold voltage distributions 10, 11, 12 and 13 are data '1', data '0', data '1', and data '0', respectively. Thus, MSB read voltages MSB_Vread1, MSB_Vread2, and MSB_Vread3 are used to read data from the selected memory cell.

Assuming that a selected memory cell is programmed to have a state of data '01', it has a threshold voltage within the threshold voltage distribution 11. During an operation for reading MSB data, the flash memory controller 200 reads MSB data bits from respective memory cells, based on the MSB read voltages. In particular, the memory cell having the threshold voltage distribution 11 is determined to be off, with the MSB read voltage MSB_Vread1 applied thereto. The memory cell having the threshold voltage distribution 11 is determined to be on, with the MSB read voltage MSB_Vread2 applied thereto. The memory cell having the threshold voltage distribution 11 is determined to be on, with the MSB read voltage MSB_Vread3 applied thereto. By this read operation, an MSB data bit may be determined to be '0'. The above-described read operation will be carried out in the same manner with respect to each of data '11', data '10', and data '00'.

LSB data bits each corresponding to the threshold voltage distributions 10, 11, 12, 13 are data '1', data '1', data '0', and data '0', respectively. Thus, an LSB read voltage LSB_Vread between the threshold voltage distribution 11 and the threshold voltage distribution 12 is applied to any selected memory cell.

As was stated above, assuming that a memory cell is programmed to store data '01', during a read operation, an LSB data bit is read from the memory cell, with the LSB read voltage LSB_Vread thereto. In particular, the memory cell in the threshold voltage distribution 11 is determined to be on when the LSB read voltage LSB Vread is applied to the memory cell. By this read operation, the LSB data bit is determined to be '0'. The above-described read operation will be carried out in the same manner with respect to each of data '11', data '10', and data '00'

By the above-described read operation, data is read from memory cells. However, as is stated above, in a case where the threshold voltage distributions are expanded due to the coupling effect, MSB or LSB data bits may be read to be an abnormal data bit.

FIG. 5 is a diagram for describing both coupling effect and an operation where a set of reference voltages are established.

Referring to FIG. 5 and a 2-bit coding table illustrated in FIG. 4, as is stated above, memory cells are capable of storing any one among data '11', data '01', data '10', and data '00'. Data '1' corresponds to an erase state and data '0' corresponds to a program state. Data '10' may be stored in a selected memory cell by changing an LSB data bit of data '11'. Data '00' may be stored in a selected memory cell by changing an MSB data bit of data '10'. Data '01' may be stored in a selected memory cell by changing an MSB data bit of data '11'. In this manner, it is possible to program a selected memory with any one of data '10', data '00', and data '01'.

For convenience of the description, only threshold voltage distributions 11 and 12 are illustrated in FIG. 5 in relation to a memory cell MC1. Referring to FIG. 5, first, assume that a memory cell MC1 is programmed to have a state of data '01'. Thus an MSB data bit of '0' is programmed in the memory cell MC1.

As is stated above, each of memory cells MC2, MC3 and MC4 is programmed to store any one among data '01', data '10', and data '00'. As is illustrated in FIG. 5, in the case that each of the memory cells MC2, MC3 and MC4 having a state of data '11' is programmed to store data '10', its threshold voltage distribution 10 is shifted to a threshold voltage distribution 12. In the case that each of the memory cells MC2, MC3 and MC4 having a state of data '10' is programmed to store data '00', its threshold voltage distribution 12 is shifted to a threshold voltage distribution 13. In the case that each of the memory cells MC2, MC3, MC4 having a state of data '11' is programmed to store data '01', its threshold voltage distribution 10 is shifted to a threshold voltage distribution 11. As illustrated in FIG. 5, a threshold voltage may be shifted by $\Delta V1$ when programming a memory cell with data '10'. The variation $\Delta V1$ is more than variations $\Delta V2$ and $\Delta V3$.

In these embodiments, a reference voltage includes reference voltages Vref1 and Vref2. The reference voltages Vref1 and Vref2 are used to read a data state with the most threshold voltage variation at a program operation. In other words, the reference voltages Vref1 and Vref2 are used to read data '10'. Thus, a read operation may be carried out with respect to the respective memory cells MC2, MC3, and MC4 by means of the reference voltages Vref1 and Vref2. In a case where a memory cell has the threshold voltage distribution 12 corresponding to data '10', it is determined to be off based on the reference voltage Vref1 and to be on based on the reference voltage Vref2. In this case, a read data bit may be '0' or '1'. In the case that a memory cell pertains to any one of the threshold voltage distributions 10, 11, 13 each corresponding to data '11', data '01', and data '00', a memory cell in any one of the threshold voltage distribution 10 and 11 is determined to be on based on the reference voltage Vref1 and a memory cell in the threshold voltage distribution 13 is determined to be off based on the reference voltage Vref2.

If memory cells MC2, MC3, and MC4 are programmed to pertain to the threshold voltage distribution 12 corresponding to data '10', they may suffer from the most threshold voltage variation. In other words, the memory cells MC2, MC3, and MC4 are programmed to have a data state suffering from the most threshold voltage variation. In this case, the memory cell MC1 may suffer from the worst coupling effect. This may cause expansion of a threshold voltage distribution of memory cells that store data '01' and suffer from the worst coupling effect, as illustrated in FIG. 5. That is, the threshold voltage distribution 11 corresponding to the memory cell MC1 storing data '01' is expanded as illustrated by a dotted line. The threshold voltage distribution 11 corresponding the memory cell MC1 programmed with data '01' state is expanded over the MSB read voltage MSB Vread2 due to the worst coupling effect. In this case, the probability that the MSB data bit read from the memory cell MC1 is determined to be erroneous is very high. Thus, the MSB data bit read from the memory cell MC1 is determined to be not '0' but '1'.

The ALU 220 inverts a data bit provided from the first buffer 211 when data bits provided from the second to fourth buffers 212~214 are determined to have the most threshold voltage variation. Excepting the above case, the ALU 220 does not invert a data bit from the first buffer 211.

If at least one of the memory cells MC2, MC3, and MC4 is not programmed to have the threshold voltage distribution 12 corresponding to data '10', the ALU 220 does not invert a data bit from the first buffer 211. Although the memory cell MC1 does not suffer from the worst coupling effect, it may suffer from the coupling effect due to adjacent memory cells MC2, MC3, and MC4. Thus, when data is read from the memory cell MC1, the error generation probability may exist. The ALU 220 provides the error correction circuit 230 with an MSB date bit of the memory cell MC1 from the first buffer 211. The error correction circuit 230 detects whether the data bit from the ALU 220 is erroneous and corrects it based on a detection result.

Error correction was described under the condition that an MSB data bit of the memory cell MC1 programmed with data '01' is read to be '1' due to the worst coupling effect. However, although the memory cell MC1 is programmed to have any one of data '11' and data '10', the above-described error correction may be applied. In other words, referring to curves 10 and 11 illustrated in FIG. 4, the above-described error correction may be applied when the memory MC1 is programmed to have data '11' and an MSB data bit of the memory MC1 is read to be '0' due to the worst coupling effect. Also, referring to curves 12 and 13 illustrated in FIG. 4, the above-described error correction may be applied although the memory MC1 is programmed to have '10' and an MSB data bit of the memory MC1 is read to be '0' due to the worst coupling effect.

Further, referring to a curve 13 illustrated in FIG. 4, although the memory MC1 is programmed to have data '00', during a read operation, a data bit read from the memory MC1 may be '0'. In this time, although the memory MC1 suffers from the worst coupling effect, the data bit read from the memory MC1 is determined to be '0' even though it is not illustrated in FIG. 5. In this case, since the ALU 220 inverts the data bit read from the memory MC1 into the data bit '1', the MSB data bit of the memory cell MC1 corrected by the ALU 220 may be an error bit. The error correction circuit 230 detects whether the MSB data bit provided from the ALU 220 is erroneous and corrects it based on a detection result.

Even though it is not illustrated in FIG. 5, an LSB data bit of the memory cell MC1 may be read to be erroneous due to the coupling effect with the programmed memory cells MC2, MC3, and MC4. During an LSB read operation, the LSB data bit read from the memory cell MC1 is provided to the error correction circuit 230. The error correction circuit 230 detects the error bit among LSB data bits and corrects the detected error bit on the basis of the ECC.

Figure 6:
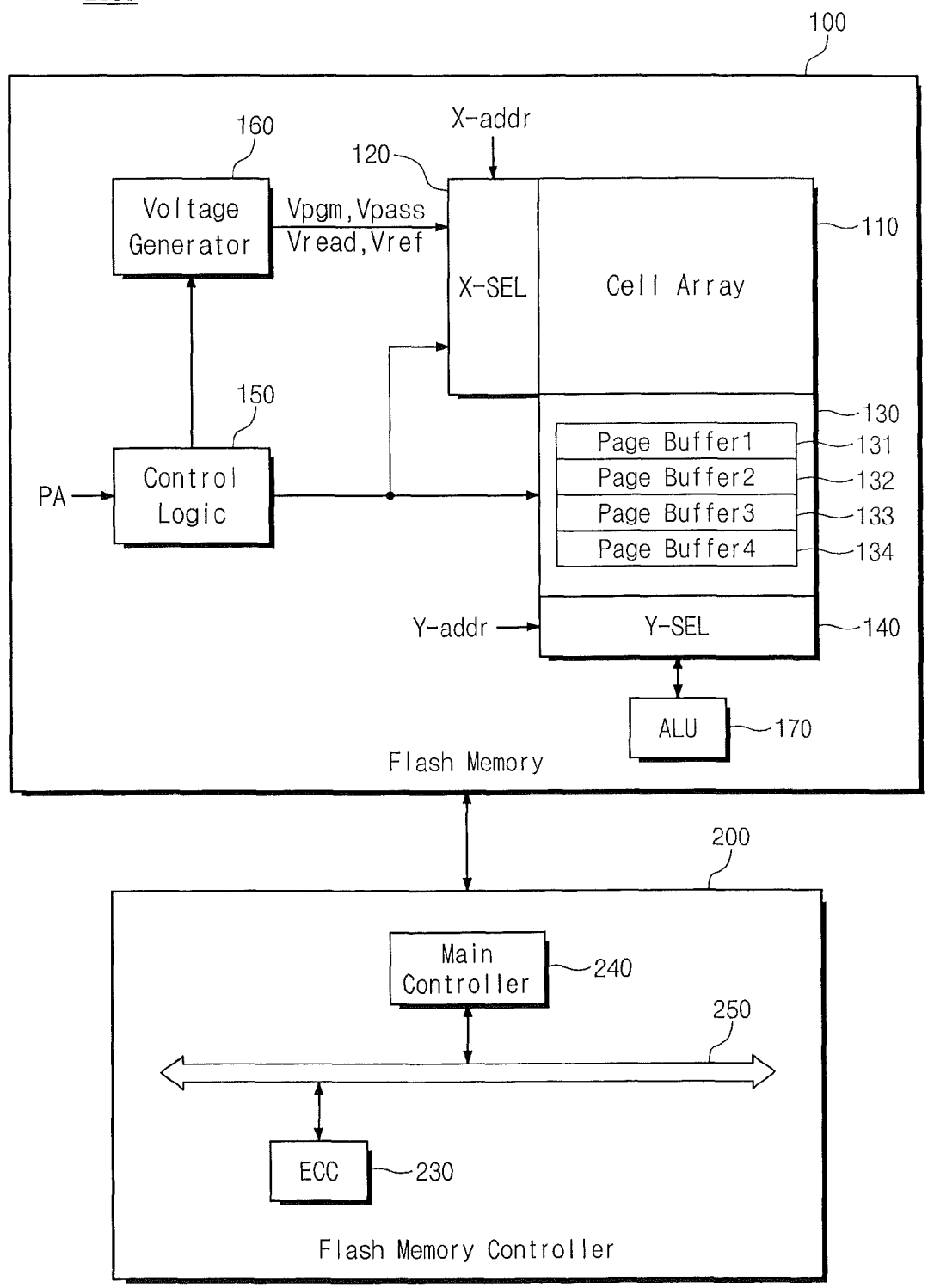
FIG. 6 is a schematic block diagram showing a flash memory system according to second embodiments of the present invention.

FIG. 6 is a schematic block diagram of a flash memory system according to second embodiments of the present invention.

Referring to FIG. 6, a flash memory 100 of a flash memory system 2000 according to the second embodiments of the present invention comprises the first through fourth page buffers 131~134, an ALU 170, and a memory controller 200. The memory controller 200 does not include the first to fourth buffers 211~214 and the ALU 230 which are illustrated in FIG. 1. Otherwise, the flash memory system 2000 illustrated in FIG. 6 can be configured the same as the flash memory system 1000 illustrated in FIG. 1. Thus, the same configurations are marked by the same symbols. A page buffer circuit 130 including the first through fourth buffers 211~214 constitutes a page buffer block.

A read operation of the flash memory system 2000 illustrated in FIG. 6 can be substantially identical to that of the flash memory system 1000 illustrated in FIG. 1 except for the following differences.

Referring to FIGS. 3 and 6, during an operation of reading an MSB data bit from a memory cell MC1, the MSB data bit of the memory cell MC1 and data bits of memory cells MC2, MC3, and MC4 are sensed by the corresponding first through fourth buffers 211~214 according to a given program sequence, respectively. As stated above, data bits are read from the memory cells MC2, MC3, and MC4, based on the reference voltages Vref1 and Vref2. During an operation of reading an LSB data bit from the memory cell MC1, the LSB data bit of the memory cell MC1 is sensed by the first buffer 131.

The MSB data bit of the memory cell MC1 sensed by the first buffer 131 and the data bits of the memory cells MC2, MC3, and MC4 sensed by the second through the fourth buffers 132~134 are provided to the ALU 220 under the control of the control logic 150. The LSB data bit of the memory cell MC1 sensed by the first buffer 131 is provided to the flash memory controller 200 under the control of the control logic 150. After this, an error bit correction process for the read data bits may be carried out in the same manner as described in relation to FIG. 1, which is omitted for ease of description. Thus, embodiments of a compare circuit are provided.

Figure 7:
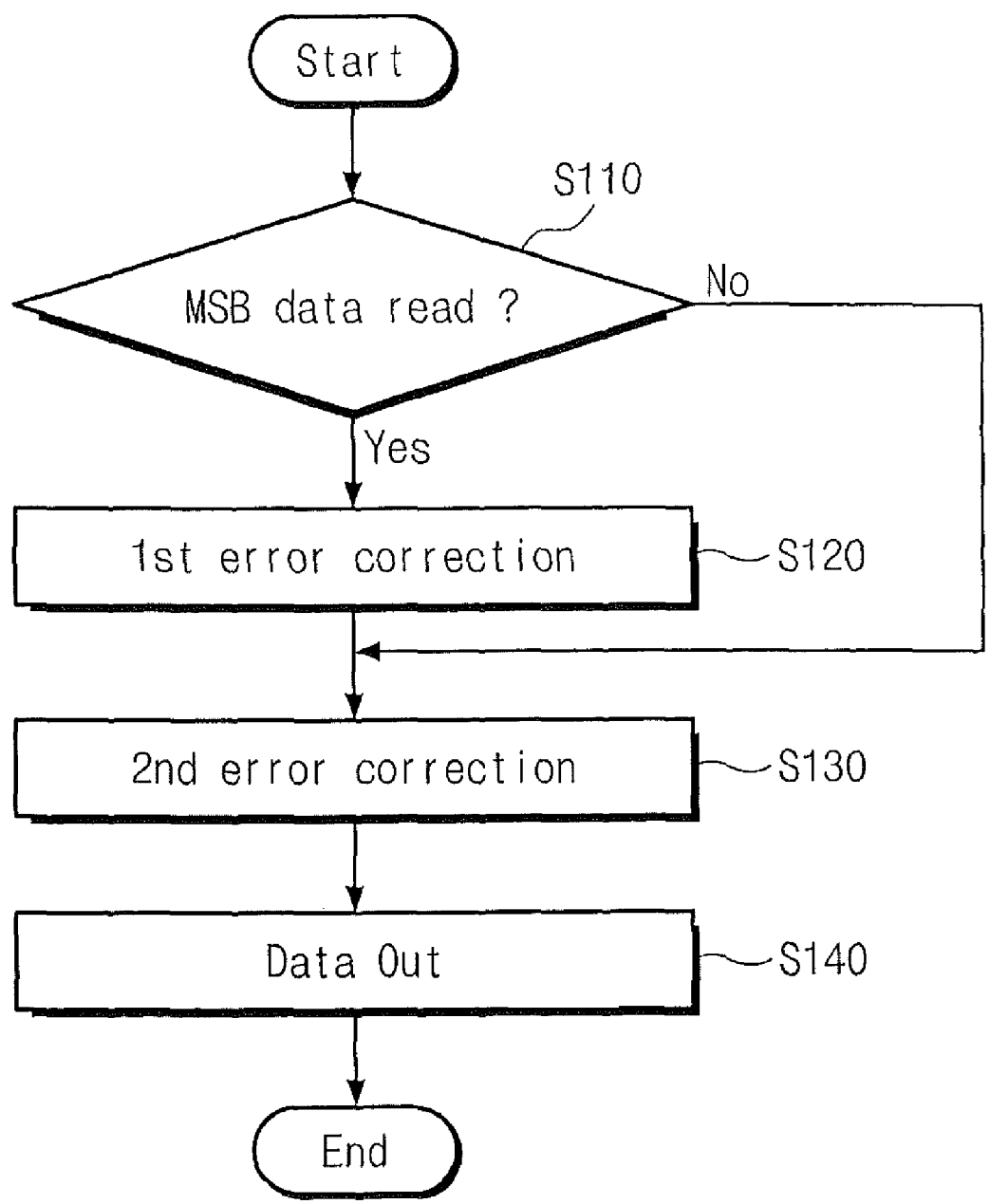
FIG. 7 is a flow chart for describing error correction of a flash memory system according to the first and the second embodiments of the present invention.

FIG. 7 is a flow chart for describing error correction systems/methods of a flash memory system according to the first and second embodiments of the present invention.

Referring to FIG. 7, at block S110, there is checked whether a read operation is related to MSB data. If so, an MSB data bit is read out from a memory cell MC1, and data bits are read out from memory cells MC2, MC2, and MC4, based on the reference voltages Vref1 and Vref2.

At block S120, the ALU 220 performs a first error correction operation where data bits read from the memory cells MC2, MC2, MC4 are compared and a MSB data bit read from the memory cell MC1 is corrected in accordance with a comparison result. At block S130, the error correction circuit 230 performs a second error correction. In other words, the error correction circuit 230 detects whether data bits provided from ALU 220 are erroneous and corrects a detected erroneous bit according to a detection result. At block S110, if a read operation is judged not to be related to MSB data, an LSB data bit read from the memory cells MC1 is provided directly to the error correction circuit 230. In this case, at block S130, the error correction circuit 230 detects whether the LSB data bit read from the memory cells MC1 is erroneous and corrects a detected erroneous bit according to a detection result. At block S140, the flash memory controller 200 outputs read-out data bits.

As a result, the flash memory systems 1000 and 2000 according to the first and second embodiments of the present invention correct data bits according to the above-described read and correction manner, so that the number of erroneous bits can be reduced. Thus, it is possible to reduce an overhead of the error correction circuit 230. Thus, embodiments of a compare circuit are provided.

Figure 8:
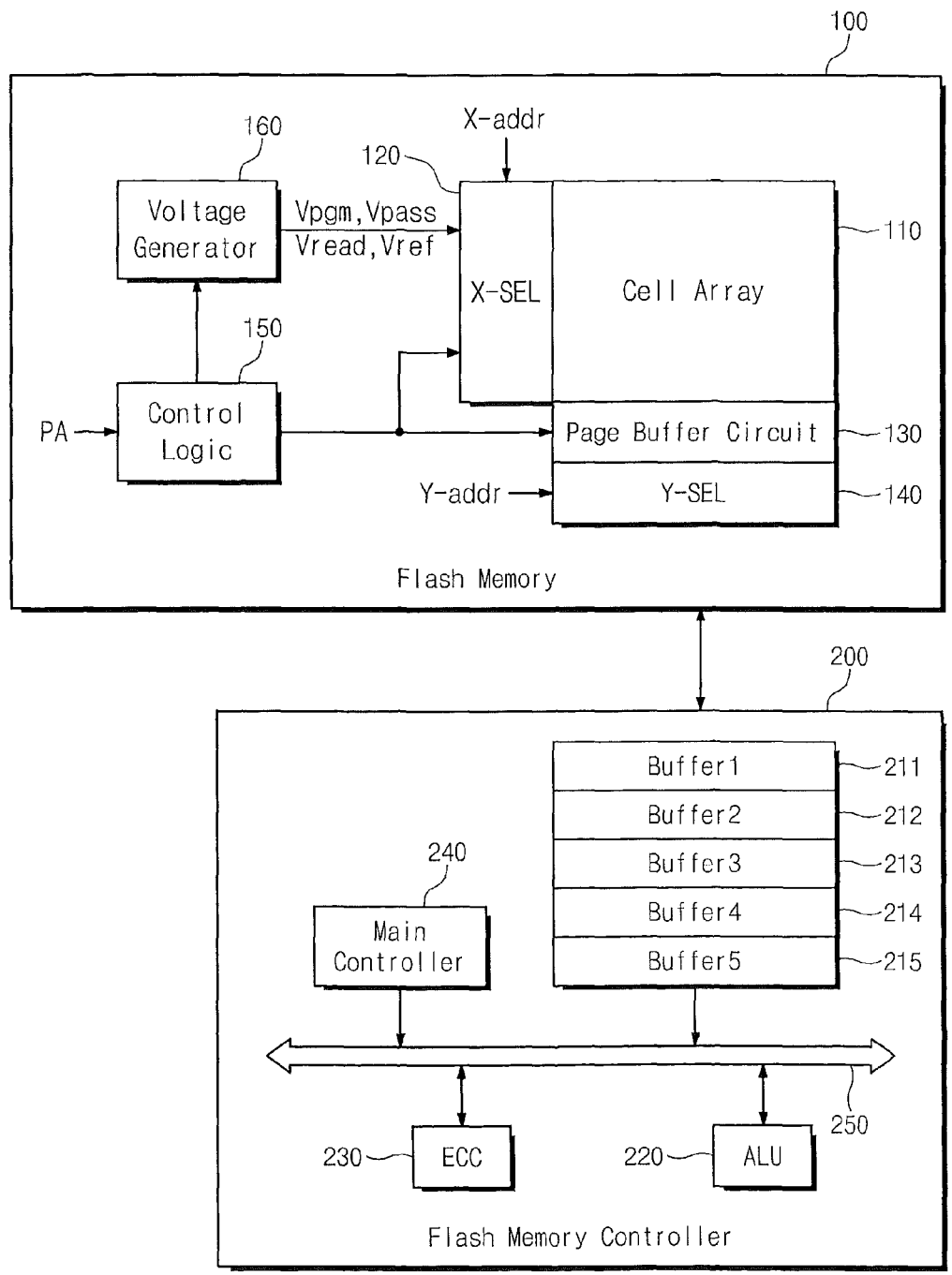
FIG. 8 is a schematic block diagram showing a flash memory system according to third embodiments of the present invention.

FIG. 8 is a schematic block diagram of a flash memory system according to the third embodiments of the present invention.

A flash memory 100 of the flash memory system 3000 illustrated in FIG. 8 is a multi-bit flash memory device. In exemplary embodiments, there will be described operations and configurations of the flash memory 100 under the condition that the flash memory 100 is a 2-bit flash memory device capable of storing 2-bit data per cell. However, the present invention is not limited to these embodiments.

Referring to FIG. 8, a flash memory controller 200 of the flash memory system 3000 according to the third embodiments of the present invention comprises first through fifth buffers 211~215. Otherwise, the flash memory system 3000 illustrated in FIG. may be is configured the same as that illustrated in FIG. 1. Thus, the same constituent elements are marked by the same symbols.

Referring to a program sequence of memory cells MC2, MC3, and MC4 illustrated in FIG. 3, when a read operation is performed with respect to the memory cell MC1, the flash memory system 3000 illustrated in FIG. 8 performs a read operation with respect to the memory cell MC2, MC3, and MC4. In other words, the flash memory system 3000 reads an MSB data bit and an LSB data bit from the memory cell MC1, and performs a read operation with respect to the memory cell MC2, MC3, and MC4 by use of the reference voltage Vref1 and Vref2. Hereinafter, a sequence for reading data bits from the memory cells MC1 to MC4 can be identical to that described in FIGS. 1 and 6, and its description is thus omitted.

The MSB and LSB data bits read from the memory cell MC1 are provided to the first and second buffers 211,212 of the flash memory controller 200, respectively. The data bits read from the memory cells MC2, MC3, and MC4 are provided to the third through fifth buffers 213~215 of the flash memory controller 200, respectively.

The first through fifth buffers 211~215 provide the data bits to the ALU 220. The ALU 220 compares the data bits provided from the third through fifth buffers 213~215 and corrects the data bits provided from the first and second buffers 211,212 in accordance with a comparison result. In other words, the ALU 220 may be capable of correcting the MSB and LSB data bits read from the memory cell MC1. Hereinafter, an error bit correction process can be substantially identical to that described in FIGS. 1 and 6, and its description is thus omitted. Thus, embodiments of a compare circuit are provided.

Figure 9:
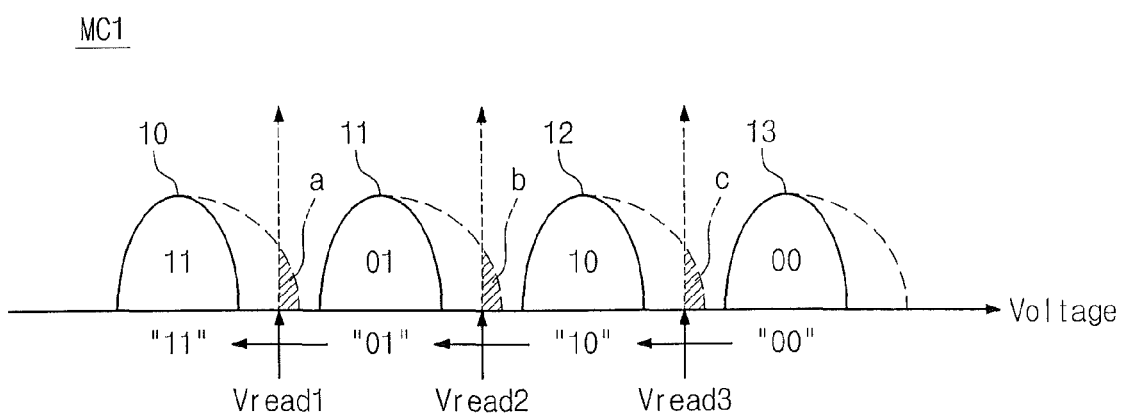
FIG. 9 is a diagram for describing error correction of a flash memory system according to the third embodiments of the present invention.

FIG. 9 is an exemplary distribution chart for describing an error correction method of a flash memory system according to the third embodiments of the present invention.

Exemplary threshold voltage distributions are illustrated in FIG. 9 under the condition that a memory cell is capable of storing 2-bit data. However, m-bit data (m is 3 and more integer) may be stored per cell. In FIG. 9, read voltages Vread1, Vread2, and Vread3 include an MSB read voltage, respectively, and the read voltage Vread2 further includes an LSB read voltage.

In FIG. 9, read and program methods for 2-bit data are described above, and description thereof is thus omitted.

An exemplary error bit correction method of the ALU 220 will be more fully described with reference to FIGS. 8 and 9.

A threshold voltage distribution of the memory cell MC1 may be expanded due to the coupling effect with adjacent memory cells MC2, MC3, and MC4 as is illustrated by a dotted line in FIG. 9. Data bits at error areas a, b, and c (hatched portions in FIG. 9) may be read erroneously. If the memory cells MC2, MC3, and MC4 with the most threshold voltage variation are programmed, the memory cell MC1 may suffer from the worst coupling effect. This means that the error detection probability to a data bit read from the memory cell MC1 is very high. In particular, the MSB data bit of the memory cell MC1 may be read at the read error ranges a, b, and c. In this case, the ALU 220 alters the data bit of the memory cell provided from the first and second buffers 211 and 212 into a low state.

For example, assume that the memory cell MC1 is programmed with data '01' corresponding to the threshold voltage distribution 11. If the memory cell MC1 has a failed state due to the worst coupling effect with the adjacent memory cells MC2, MC3, and MC4, data read from the memory cell MC1 may be data '10' that corresponds to the threshold voltage distribution 12. The ALU 220 alters data provided from the first and second buffers 211 and 212 into data '01'. Also, if the memory cell MC1 has any one of data '11' and data '10' and a failed state due to the worst coupling effect with the adjacent memory cells MC2, MC3, and MC4, as is stated above, data read from the memory cell MC1 is altered into the low state by the ALU 220.

In the case that the memory cell MC1 is programmed to have data '00' and its threshold voltage is shifted into a hatched area due to the worst coupling effect with the adjacent memory cells MC2, MC3, and MC4, data read from the memory cell MC1 is corrected by the error correction circuit 230 in the same manner as described with reference to the flash memory system 1000.

Figure 10:
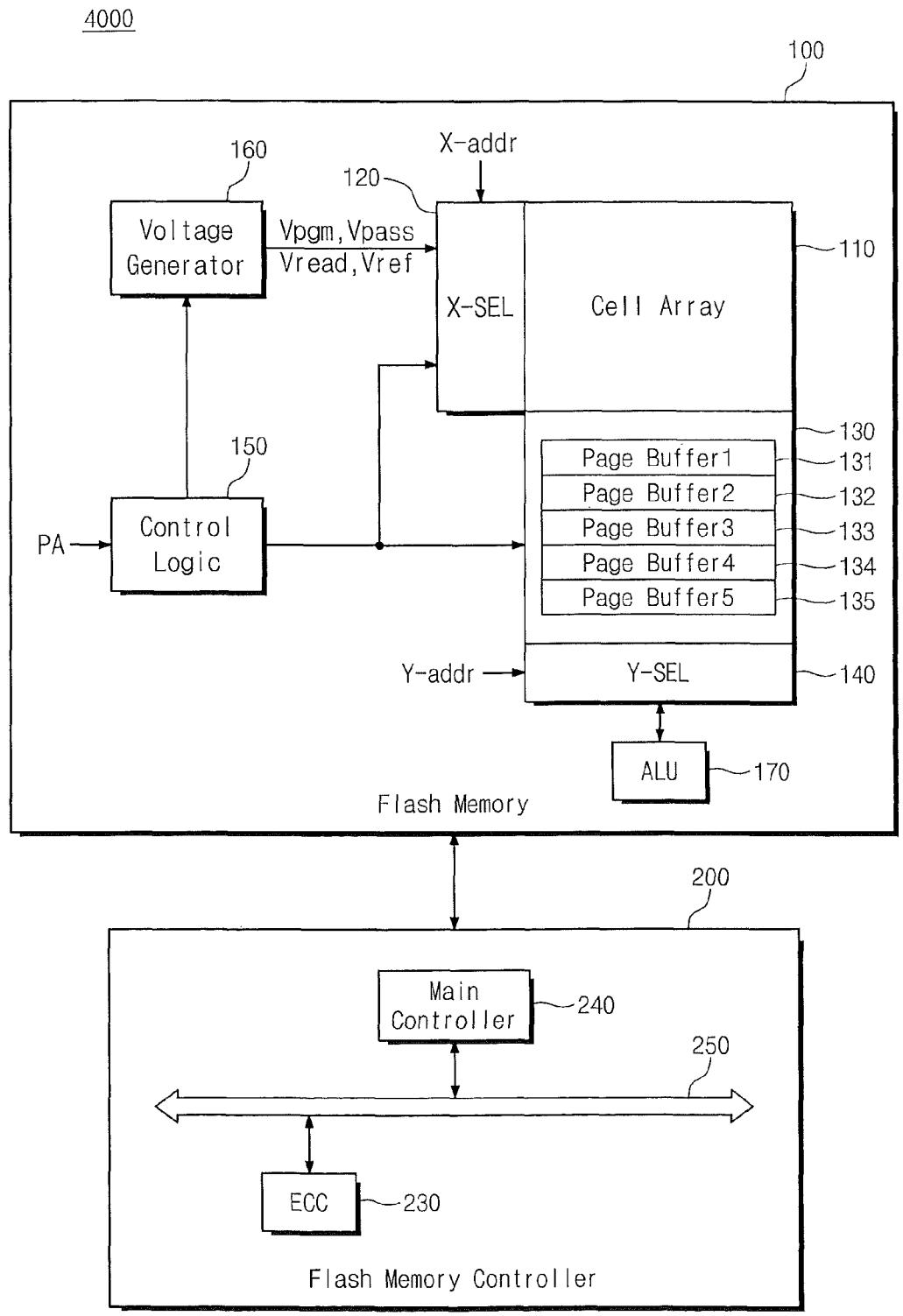
FIG. 10 is a schematic block diagram showing a flash memory system according to fourth embodiments of the present invention.

FIG. 10 is a schematic block diagram of a flash memory system according to fourth embodiments of the present invention.

Referring to FIG. 10, a flash memory 100 of the flash memory system 4000 according to the fourth embodiments of the present invention comprises the first through fifth buffers and an ALU 170. Excepting this configuration, the flash memory system 4000 illustrated in FIG. 10 can be configured identically to that of the flash memory system 3000 illustrated in FIG. 8.

When a read operation is performed with respect to the memory cell MC1, the MSB data bit and the LSB data bit are read out (or sensed) from the memory cell MC1 via the first and second buffers 131 and 132, respectively. The data bits read from the memory cells MC2, MC3, and MC4 are read out (or sensed) via the third through fifth buffers 133~135, respectively. In case of the flash memory system 4000 according to the fourth embodiments of the present invention, read and error bit correction methods can be the same as those of the flash memory system 3000 according to the third embodiments of the present invention. Thus, embodiments of a compare circuit are provided.

Figure 11:
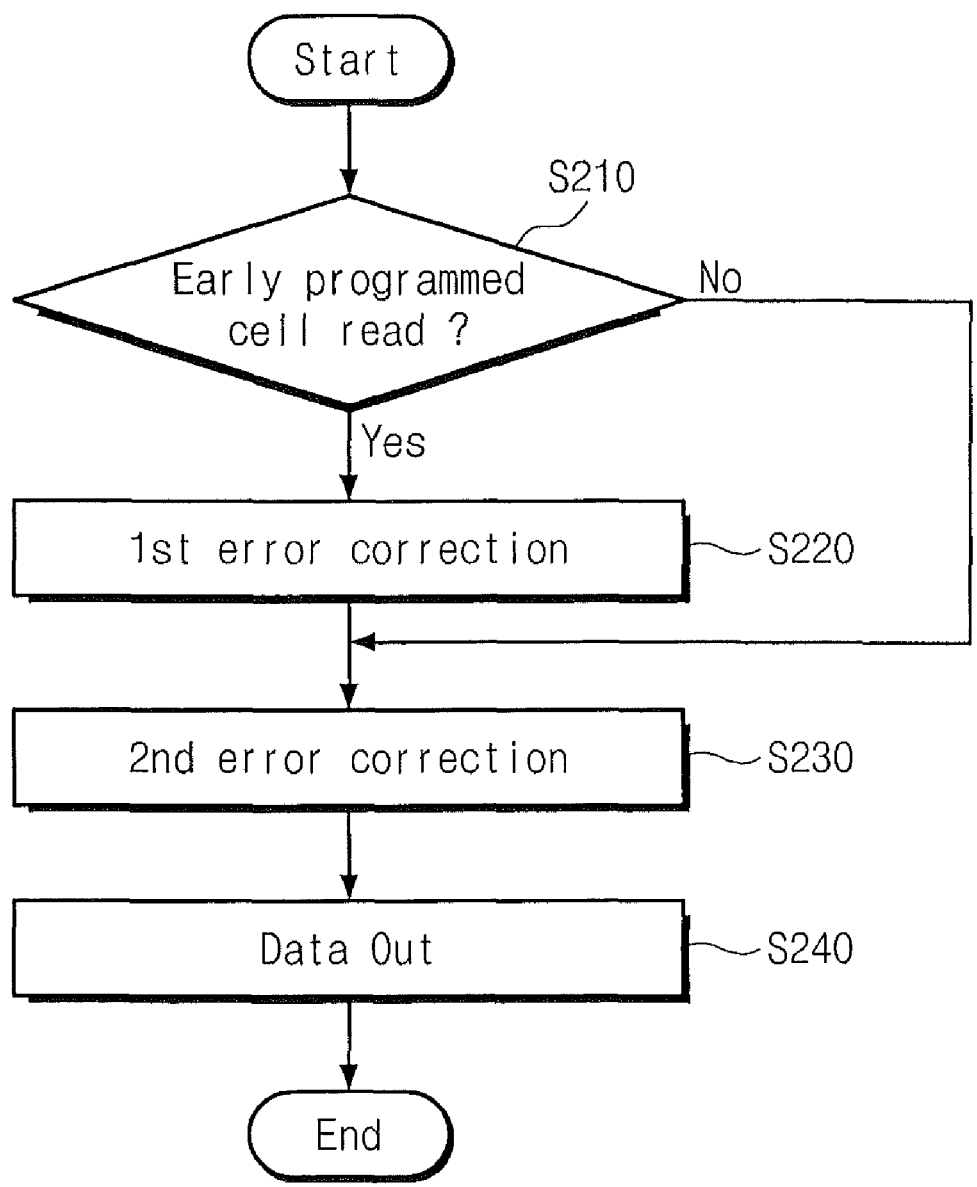
FIG. 11 is a flow chart for describing error correction of a flash memory system according to the third and the fourth embodiments of the present invention.

FIG. 11 is a flow chart for describing an error correction operation of a flash memory system according to the third and fourth embodiments of the present invention.

Referring to FIG. 11, at block S210, an MSB data bit is read out from the memory cell MC1 during a read operation with respect to the memory cell MC1. Also, the data bits are read out from the memory cells MC2, MC2, and MC4, based on the reference voltages Vref1 and Vref2.

At block S220, the ALU 170/220 compares data bits read from the memory cells MC2, MC3, and MC4 and corrects the MSB data bit read from the memory cells MC1 into data corresponding to a threshold voltage distribution of a low state in accordance with a comparison result.

At block S230, an error correction operation is then made through the error correction circuit 230. In other words, the error correction circuit 230 detects the error bit among data bits provided from ALU 170/220 and corrects the detected error bit, on the basis of the ECC. At block S210, during a read operation about the memory cells MC2 and MC4, the data bits read from the memory cells MC2, MC4 are provided to the error correction circuit 230. At block S230, the error correction circuit 230 detects whether the data bits read from the memory cells MC2, MC4 are erroneous, and corrects the detected error bit on the basis of a detection result. At block S240, data bits output from the error correction circuit 230 are output.

Referring to the read operation of above flash memory system 1000, a read manner of the memory cell MC3 can be the same as that of the memory cell MC1.

As a result, the flash memory systems 3000 and 4000 according to the third and fourth embodiments of the present invention are capable of correcting data bits according to a given condition. The flash memory systems 3000 and 4000 are capable of reducing the number of error bits to be corrected by the error correction circuit 230 through the ALU 220/170. Thus, overhead of the error correction circuit 230 can be reduced. Thus, embodiments of a compare circuit are provided.

Figure 12:
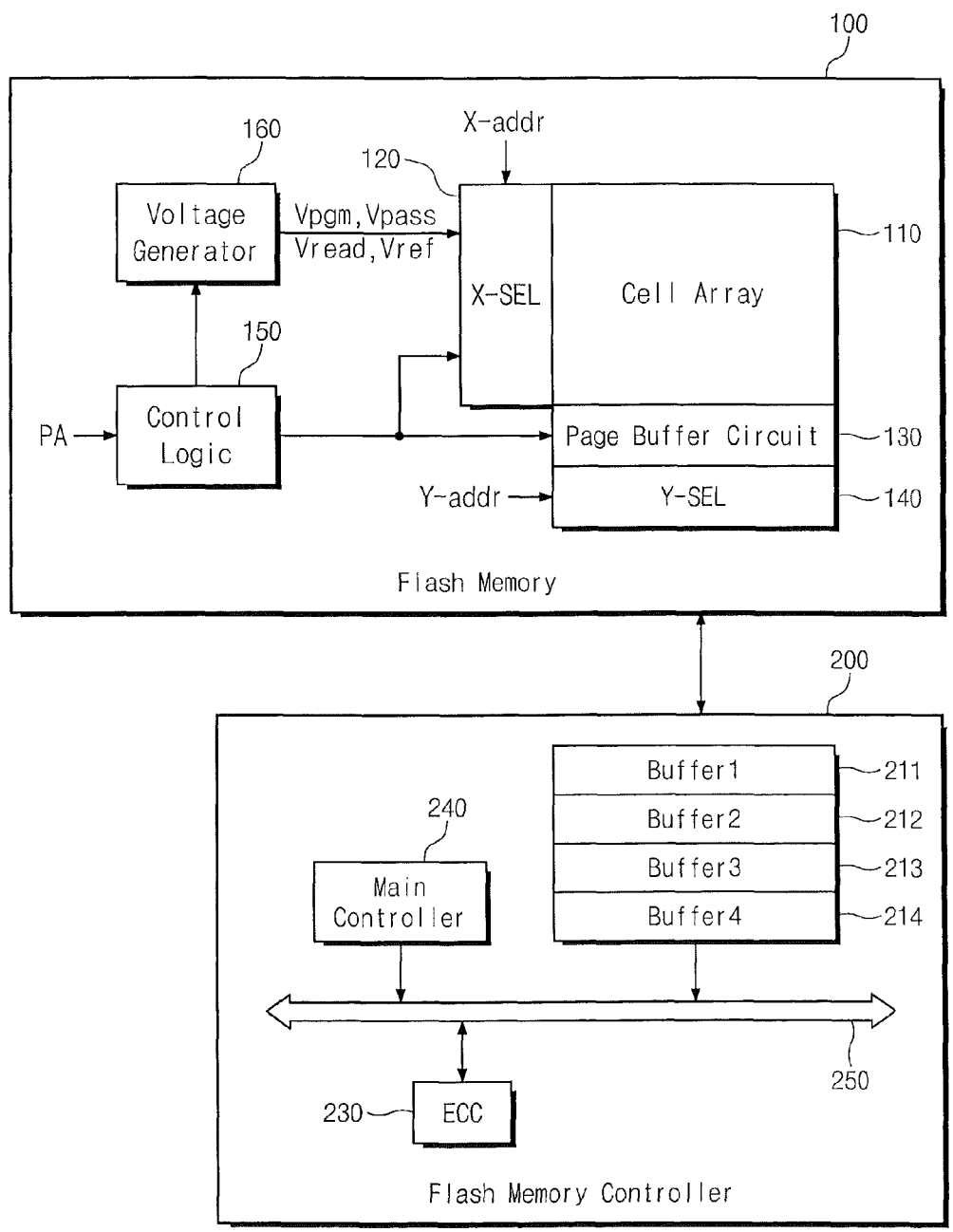
FIG. 12 is a schematic block diagram showing a flash memory system according to fifth embodiments of the present invention.

FIG. 12 is a schematic block diagram of a flash memory system according to fifth embodiments of the present invention.

Referring to FIG. 12, the flash memory system 5000 according to the fifth embodiment of the present invention does not comprise an ALU 220. Otherwise, the flash memory system 5000 illustrated in FIG. 12 can be configured to the same as that in FIG. 1. Since the read operation of the flash memory system 5000 can be the same as the read operation of the flash memory system, its description will be omitted.

The first through fourth buffers 141~144 provide data bits to the main controller 240. The main controller 240 compares the data bits from the second through fourth buffers 142~144. In a case whether the data bits of the memory cells MC2, MC3, and MC4 read by use of the reference voltages Vref1 and Vref2 all are the same value, the memory cell MC1 is affected by the worst coupling effect. In this case, the MSB data bit read from the memory cell MC1 is judged to be an "erasure state". The erasure state indicates such a state that it is difficult (or even impossible) to define a data value exactly due to lowering of data reliability. In this case, the error bit detection probability of the MSB data bit read from the memory cell MC1 is very high. If the data bits from the second to fourth buffers 142~144 all are the same value, the main controller 240 MSB judges a data bit read from the memory cell MC1 to be the erasure state. The main controller 240 provides erasure state information to the error correction circuit 230.

During the read operation, the error correction circuit 230 receives data and ECC data from the page buffer circuit 130. The error correction circuit 230 detects whether the received data is erroneous, based on the ECC data and corrects the received data according to a detection result. In this time, the error correction circuit 230 detects an erroneous data bit by comparing the read data and the ECC data without information related to an error state bit. If there is provided erasure state information associated with an MSB data bit read out from MC1 via the main controller 240, there is provided information with respect to a data bit that is detected to be an error state. Accordingly, the error correction circuit 230 is capable of detecting and correcting more erroneous data bits using the erasure state information as compared with its original error detection/correction capacity. This means that performance of the error correction circuit 230 can be improved. Thus, embodiments of a compare circuit are provided.

Figure 13:
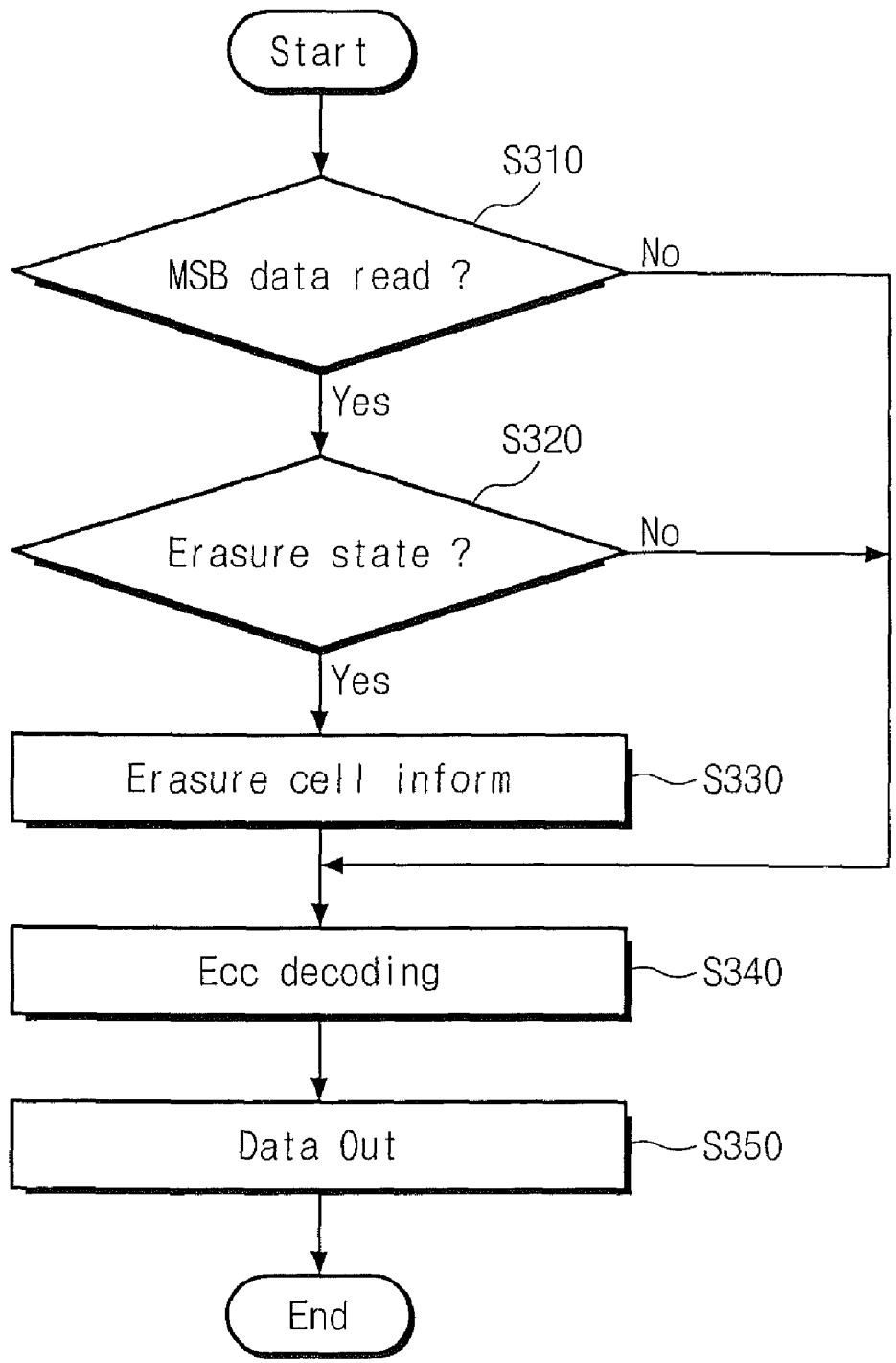
FIG. 13 is a flow chart for describing error correction of a flash memory system according to the fifth embodiments of the present invention.

FIG. 13 is a flow chart for describing error correction of a flash memory system according to the fifth embodiments of the present invention.

Referring to FIG. 13, at block S310, there is judged whether an MSB data bit is read out from a memory cell MC1. At this time, data bits are read out from the memory cells MC2, MC3, and MC4.

The main controller 240 compares data bits read from the memory cells MC2, MC3, and MC4 and judges the erasure state of the MSB data bit read from the memory cell MC1 in accordance with a comparison result.

At block S310, when the LSB data bit is read out from the memory cell MC1, it is provided to the error correction circuit 230. At block S340, the error correction circuit 230 detects an erroneous state of the LSB data bit and corrects it based on a detection result. At block S320, in a case where no MSB data bit read from the memory cell MC1 has an erasure state, the error correction circuit 230 detects the LSB data bit read from the memory cell MC1 and corrects it based on a detection result.

As a result, the error correction circuit 230 detects and corrects more erroneous bits using the erasure state information as compared with the original correction capability. Thus the flash memory system 5000 is capable of improving performance of the error correction circuit 230. Thus, embodiments of a compare circuit are provided.

Figure 14:
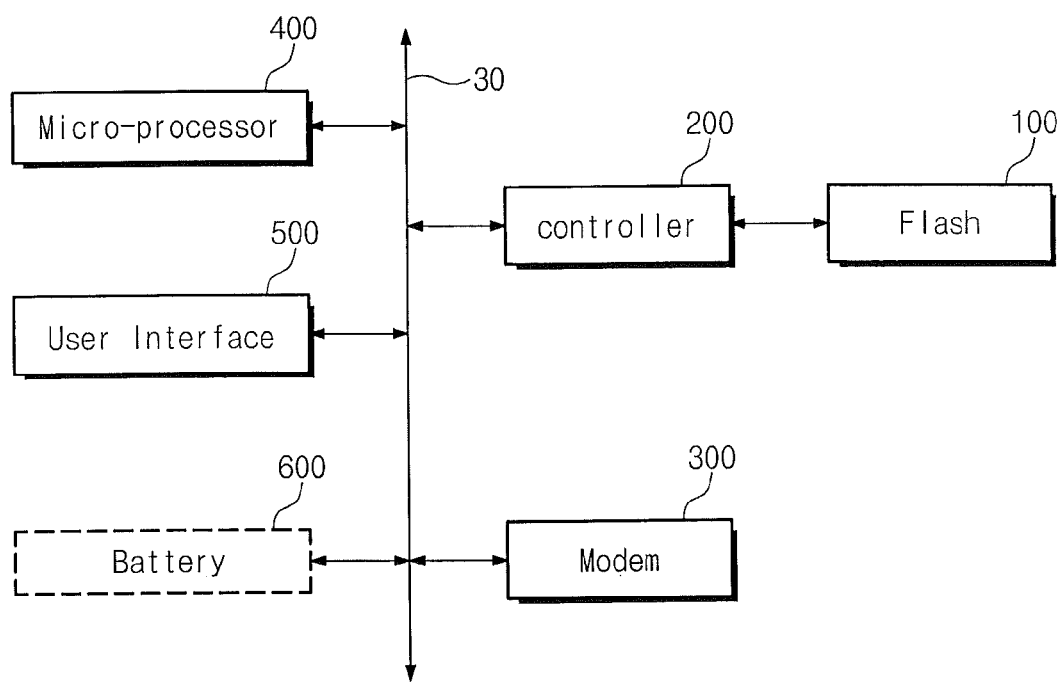
FIG. 14 is a schematic block diagram showing a computing system comprising a flash memory device and a flash memory controller according to various embodiments of the present invention.

FIG. 14 shows a computing system comprising a flash memory device and a flash memory controller according to various embodiments of the present invention.

The flash memory device is a nonvolatile memory device capable of holding stored data even at power-off. With the increased application of mobile devices such as a cellular phone, a PDA, digital camera, a portable game console, and a MP3, the flash memory device is widely used as data storage and code storage. Also the flash memory device may be used at HDTV, DVD, router, and applications such as GPS. A computing system comprising the flash memory device 100 and the flash memory controller 200 according to various embodiments of the present invention is illustrated in FIG. 14. The computing system according to various embodiments of the present invention comprises microprocessor 400, user interface 500, modem 300 such as baseband chipset, the flash memory controller 200, and the flash memory device 100. The flash memory controller 200 and the flash memory device 100 can be configured as illustrated in FIGS. 1, 6, 8, 10, and/or 12. N-bit data (N a positive integer) processed/to be processed by the microprocessor 400 will be stored in the flash memory device 100 via the flash memory controller 200. In a case where the computing system is the mobile device, the computing system may further include a battery 600 to supply an operation power of the computing system. An application chipset, Camera Image Processor, and a mobile DRAM may be additionally provided to the computing system.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. A flash memory system comprising a multi-bit flash memory device and a flash memory controller,
the multi-bit flash memory device comprising a memory cell array including memory cells arranged in rows and columns; a read circuit configured to read data from the memory cell array; and a control logic configured to control the read circuit so as to successively read data from selected memory cells and adjacent memory cells to the selected memory cells when a read operation is requested with respect to the selected memory cells; and
the flash memory controller configured to compare data read from the adjacent memory cells to the selected memory cells and to correct data read from the selected memory cells according to a comparison result.

2. The flash memory system of claim 1, wherein the memory cells are divided into even cells and odd cells, the selected memory cells including firstly programmed ones of the even cells and the odd cells.

3. The flash memory system of claim 1, wherein the read circuit comprises:
a voltage generator circuit configured to generate first and second reference voltages to be applied to a selected row at a read operation with respect to the adjacent memory cells to the selected memory cells and an MSB read voltage to be applied to a selected row at a read operation with respect to the selected memory cells;
a row selector circuit configured to select the rows and drive the selected row with one of the first reference voltage, the second reference voltage, and the MSB read voltage; and
a page buffer circuit configured to read data from memory cells of the selected row.

4. The flash memory system of claim 3, wherein the first and second reference voltages are a read voltage used to read a data state suffering from the most threshold voltage variation when there are changed data states of the adjacent memory cells to the selected memory cells based on a program operation.

5. The flash memory system of claim 3, wherein when a read operation is requested with respect to MSB data stored in the selected memory cells, the adjacent memory cells to the selected memory cells are read by use of the first and second reference voltages.

6. The flash memory system of claim 3, wherein the flash memory controller comprises:
a buffer block configured to store data read from the selected memory cells and data read from the adjacent memory cells to the selected memory cells;
an arithmetic logic circuit configured to compare the data read from the adjacent memory cells to the selected memory cells provided via the buffer block and to correct the data read from the selected memory cells provided via the buffer block based upon the comparison result; and
an ECC circuit configured to detect and correct an error of data provided from and corrected by the arithmetic logic circuit.

7. The flash memory system of claim 6, wherein when data read from the adjacent memory cells to the selected memory cells has a value corresponding to the most threshold voltage variation, the arithmetic logic circuit corrects data, read from the selected memory cells.

8. The flash memory system of claim 7, wherein when data read from the adjacent memory cells to the selected memory cells has a value corresponding to the most threshold voltage variation, the arithmetic logic circuit corrects data read from the selected memory cells corresponding to a threshold voltage distribution of a lower state on the basis of a threshold voltage distribution corresponding to data states read from the selected memory cells.

9. The flash memory system of claim 6, wherein when at least one of data bits read from the adjacent memory cells to the selected memory cells does not have a value corresponding to the most threshold voltage variation, the arithmetic logic circuit does not correct data read from the selected memory cells.

10. The flash memory system of claim 6, wherein data read from memory cells includes an ECC code, and the ECC circuit detects and corrects an error of data, corrected and read from the selected memory cells, based upon the ECC code.

11. The flash memory system of claim 1, wherein each of the columns has a first bit line and a second bit line.

12. The flash memory system of claim 1, wherein the selected memory cells are connected to the selected row and the first bit lines, the adjacent memory cells to the selected memory cells having first memory cells connected to the selected row and the second bit lines, second memory cells connected to an upper row of the selected row and the first bit lines, and third memory cells connected to the upper row of the selected row and the second bit lines.

13. A flash memory system comprising:
a multi-bit flash memory device including a memory cell array including memory cells arranged in rows and columns; a read circuit configured to read data from the memory cell array; and a control logic configured to control the read circuit so as to successively read data from selected memory cells and adjacent memory cells to the selected memory cells when a read operation is requested with respect to the selected memory cells; and an arithmetic logic circuit configured to compare data read from the adjacent memory cells to the selected memory cells and to correct data read from the selected memory cells according to a comparison result; and
the flash memory controller configured to detect and correct an error of data corrected by and provided from the multi-bit flash memory device.

14. The flash memory system of claim 13, wherein the memory cells are divided into even cells and odd cells, the selected memory cells including firstly programmed ones of the even cells and the odd cells.

15. The flash memory system of claim 13, wherein the read circuit comprises:
a voltage generator circuit configured to generate first and second reference voltages to be applied to a selected row at a read operation with respect to the adjacent memory cells to the selected memory cells and an MSB read voltage to be applied to a selected row at a read operation with respect to the selected memory cells;
a row selector circuit configured to select the rows and drive the selected row with one of the first reference voltage, the second reference voltage, and the MSB read voltage; and
a page buffer circuit configured to read data from memory cells of the selected row.

16. The flash memory system of claim 15, wherein the first and second reference voltages are a read voltage used to read a data state suffering from the most threshold voltage variation when there are changed data states of the adjacent memory cells to the selected memory cells based on a program operation.

17. The flash memory system of claim 15, wherein when a read operation is requested with respect to MSB data stored in the selected memory cells, the adjacent memory cells to the selected memory cells are read by use of the first and second reference voltages.

18. The flash memory system of claim 13, wherein the flash memory controller comprises an ECC circuit that is configured to detect and correct an error of data provided from and corrected by the arithmetic logic circuit.

19. The flash memory system of claim 13, wherein when data read from the adjacent memory cells to the selected memory cells has a value corresponding to the most threshold voltage variation, the arithmetic logic circuit corrects data read from the selected memory cells.

20. The flash memory system of claim 19, wherein when data read from the adjacent memory cells to the selected memory cells has a value corresponding to the most threshold voltage variation, the arithmetic logic circuit corrects data read from the selected memory cells corresponding to a threshold voltage distribution of a lower state on the basis of a threshold voltage distribution corresponding to data states read from the selected memory cells.

21. The flash memory system of claim 13, wherein when at least one of data bits read from the adjacent memory cells to the selected memory cells does not have a value corresponding to the most threshold voltage variation, the arithmetic logic circuit does not correct data read from the selected memory cells.

22. The flash memory system of claim 13, wherein when a read operation of the selected memory cells is not an operation of reading MSB data, the control logic controls the read circuit so as to perform a read operation only with respect to the selected memory cells, data read from the selected memory cells being transferred to the flash memory controller directly or via the page buffer circuit.

23. The flash memory system of claim 18, wherein data read from memory cells includes an ECC code, and the ECC circuit detects and corrects an error of data, corrected and read from the selected memory cells, based upon the ECC code.

24. The flash memory system of claim 13, wherein each of the columns has a first bit line and a second bit line.

25. The flash memory system of claim 24, wherein the selected memory cells are connected to the selected row and the first bit lines, the adjacent memory cells to the selected memory cells having first memory cells connected to the selected row and the second bit lines, second memory cells connected to an upper row of the selected row and the first bit lines, and third memory cells connected to the upper row of the selected row and the second bit lines.

26. A data error correcting method in a flash memory system that has memory cells arranged in rows and columns, comprising:
successively reading data from selected memory cells and adjacent memory cells to the selected memory cells when a read operation is requested with respect to the selected memory cells;
comparing data read from the adjacent memory cells to the selected memory cells to correct data read from the selected memory cells based on a comparison result; and
correcting data corrected and read from the selected memory cells based on an ECC code included in data read from the selected memory cells.

27. The method of claim 26, wherein the adjacent memory cells to the selected memory cells are read by use of at least one reference voltage.

28. The method of claim 27, wherein the reference voltage includes a first reference voltage and a second reference voltage,
the first and second reference voltages being read voltages used to read a data state suffering from the most threshold voltage variation when there are changed data states of the adjacent memory cells to the selected memory cells at a program operation.

29. The method of claim 26, wherein if data read from the adjacent memory cells to the selected memory cells is judged to have a value corresponding to the most threshold voltage variation,
data read from the selected memory cells being corrected to have a data value corresponding to a threshold voltage distribution of a lower state on the basis of a threshold voltage distribution corresponding to data states read from the selected memory cells.

30. A method of reading in a memory system, comprising:
reading MSB data of a selected memory cells and successively reading adjacent memory cells to the selected memory cells in response to a first read operation; and
reading LSB data of the selected memory cells in response to a second read operation.

31. The method of claim 30, further comprising correcting MSB data read from the selected memory cells based on data read from the adjacent memory cells to the selected memory cells.

32. The method of claim 30, wherein the adjacent memory cells to the selected memory cells are read by use of at least one reference voltage.

33. The method of claim 32, wherein the reference voltage includes a first reference voltage and a second reference voltage, the first and second reference voltages being read voltages used to detect a data state suffering from the most threshold voltage variation when data states of the adjacent memory cells to the selected memory cells are changed at a program operation.

34. The method of claim 30, wherein if data read from the adjacent memory cells to the selected memory cells is judged to have a value corresponding to the most threshold voltage variation, data read from the selected memory cells is inverted.

35. The method of claim 30, wherein the LSB data of the selected memory cells is performed regardless of the adjacent memory cells to the selected memory cells.

* * * * *